United States Patent
Srivastava et al.

(10) Patent No.: US 6,344,759 B1
(45) Date of Patent: Feb. 5, 2002

(54) HYBRID DATA AND CLOCK RECHARGING TECHNIQUES IN DOMINO LOGIC CIRCUITS MINIMIZES CHARGE SHARING DURING EVALUATION

(75) Inventors: Pranjal Srivastava, Austin; Patrick W. Bosshart; Uming Ko, both of Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/420,160

(22) Filed: Oct. 18, 1999

(Under 37 CFR 1.47)

(51) Int. Cl.[7] .................. H03K 19/096; H03K 19/20
(52) U.S. Cl. ..................... 326/98; 326/95; 326/121
(58) Field of Search ................... 326/95, 98, 83, 326/121

(56) References Cited

U.S. PATENT DOCUMENTS

| | | | |
|---|---|---|---|
| 5,146,115 A | * 9/1992 | Benhamida | 326/98 |
| 5,661,675 A | * 8/1997 | Chin et al. | 364/768 |
| 5,831,451 A | * 11/1998 | Bosshart | 326/93 |
| 5,838,169 A | * 11/1998 | Schorn | 326/98 |
| 5,838,170 A | * 11/1998 | Schorn | 326/98 |
| 6,111,434 A | * 8/2000 | Ciraula et al. | 326/98 |

* cited by examiner

Primary Examiner—Michael Tokar
Assistant Examiner—Daniel D. Chang
(74) Attorney, Agent, or Firm—Robert D. Marshall, Jr.; W. James Brady, III; Frederick J. Telecky, Jr.

(57) ABSTRACT

A domino logic circuit includes a precharge device precharging a precharge node during a precharge phase and a logic block receiving plural input signals to conditionally discharge the precharge node. In this improvement a second precharge device precharges an intermediate node when a particular input signal controls its corresponding logic device to be nonconducting. The intermediate node precharged by this second precharge device may be any intermediate node including the last in a serial chain from the precharge node. This second precharge device may be used with a third precharge device according to the prior art which precharges the intermediate node during the precharge phase. This domino logic circuit may be used with another precharge device controlled by a second input signal different from the first input signal. This additional precharge device may be used to precharge the same intermediate node or another intermediate node. If the input signal controlling the second precharge device is unconstrained, then the circuit preferably includes a clock controlled precharge device to precharge the intermediate node during the precharge phase and a discharge control device disposed between said logic block and ground preventing discharge during the precharge phase. Alternatively, the input signal may be clocked and guaranteed low during the precharge phase. In this case, the clocked precharge of the intermediate node and the discharge control device are optional.

13 Claims, 2 Drawing Sheets

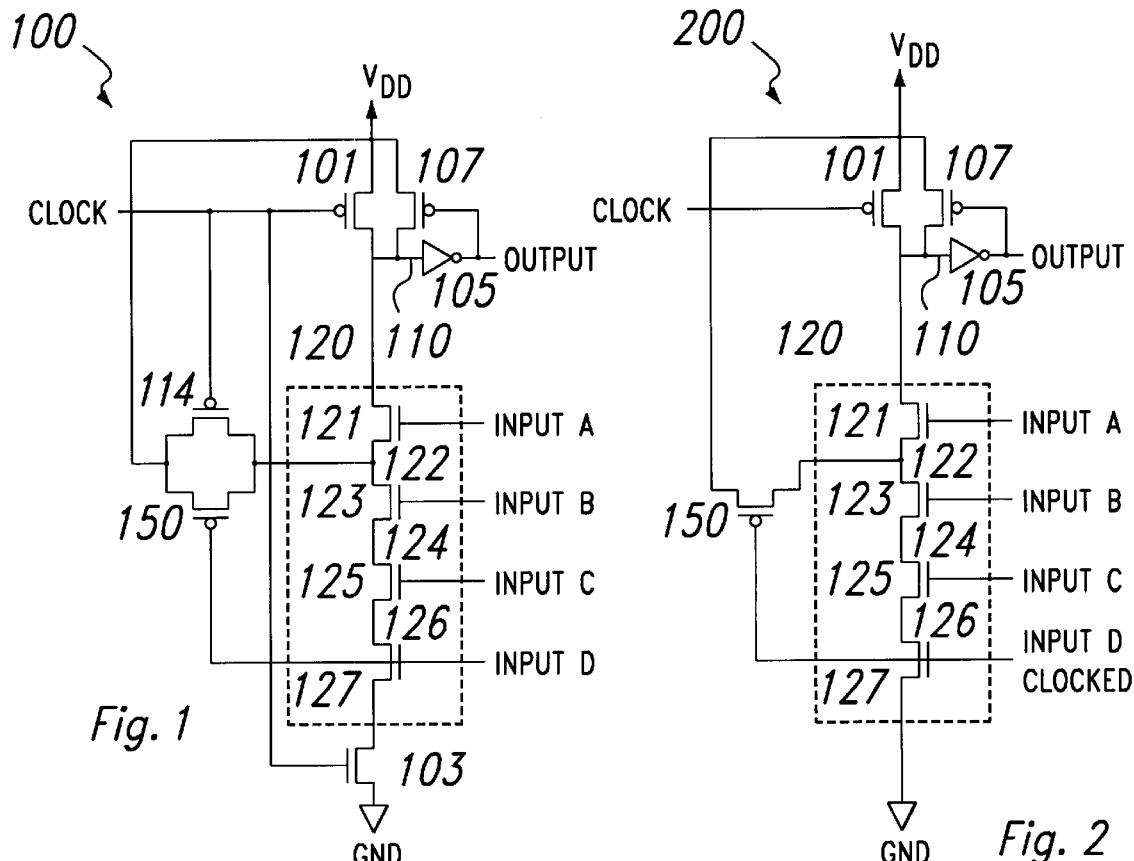
Fig. 1
Fig. 2
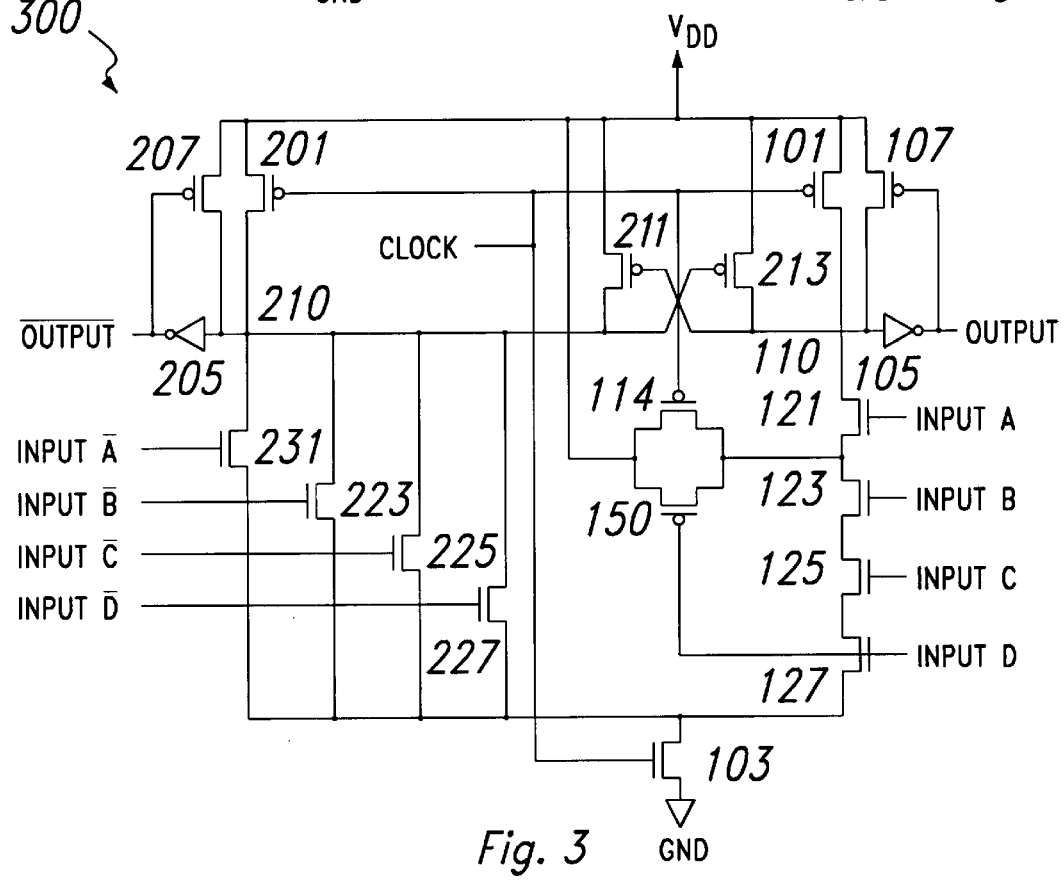
Fig. 3

HYBRID DATA AND CLOCK RECHARGING TECHNIQUES IN DOMINO LOGIC CIRCUITS MINIMIZES CHARGE SHARING DURING EVALUATION

TECHNICAL FIELD OF THE INVENTION

The technical field of this invention is a dynamic logic circuit type called domino logic or precharge/conditional discharge logic.

BACKGROUND OF THE INVENTION

This invention concerns a problem with a dynamic logic circuit type called domino logic. In domino logic, a circuit node is charged to a precharge voltage during a precharge time. In the typical application, a P-channel MOSFET charges the circuit node to the supply voltage. During a evaluate phase, the precharging ceases. Instead a logic block conditionally discharges the circuit node. If the logic condition of the logic block is satisfied corresponding to a "1" output, then at least one conduction path is formed between the precharge node and ground. This conduction path discharges the charge on the precharge node reducing its voltage to near the ground potential. If the logic condition of the logic block is not satisfied corresponding to a "0" output, then no conduction path exists between the precharge node and ground. The logic block is typically constructed with one or more N-channel MOSFETs. Since the charge remains on the precharge node, its voltage does not change. At the end of the evaluate phase a sensing circuit, typically an inverter, senses the voltage on the precharge node and drives the output accordingly.

One of the good features of domino logic is the capability of forming arbitrarily complex logic terms in the logic block. The typical data processing apparatus will have at least some functions that require many logic terms having both AND and OR terms. Domino logic provides the opportunity to form complex logic functions within a relatively small logic block.

A problem exists with domino logic that inhibits its use to embody wide input AND gates. For AND gates the logic block is a cascade series of N-channel MOSFETs. The AND condition is satisfied only if all the N-channel MOSFETs are turned ON during the evaluate phase. Only then will a discharge path exist between the precharge node and ground. Wide input AND gates require a long chain of such N-channel MOSFETs. The problem with such domino logic is called charge sharing. When some but not all of the N-channel MOSFETs are ON, the charge on the capacitance of the precharge node is shared with all the parasitic capacitance of the thus connected intermediate nodes. This charge sharing reduces the charge on the precharge node and hence reduces its voltage. This voltage reduction due to charge sharing decreases the noise margin of the sensing circuit. In severe cases this charge sharing can so reduce the voltage that the sensing circuit senses the wrong condition and produces the wrong output. Note that this charge sharing problem is worse when all the chain of N-channel MOSFETs are ON except for the N-channel MOSFET nearest ground which is OFF. This worst case couples the maximum number of nodes to the precharge node without discharging the precharge node. Thus the charge on the precharge node must be distributed over the maximum capacitance, contributing to the maximum reduction in voltage when the precharge node is not discharged.

Wide input OR gates do not present a charge sharing problem. OR gates are typically implemented with parallel N-channel MOSFETs between the precharge node and ground. To satisfy the OR condition all the OR gates must be OFF. If any of the N-channel MOSFETs is ON, then the precharge node is discharged. No serial chain with additional nodes to share charge appear for OR gates. Thus OR gates are not a problem. Logic functions with both AND and OR terms may present a charge sharing problem depending on the number of AND terms.

One solution to this problem is to limit the number of AND terms evaluated by any particular gate circuit. Limiting the number of AND terms limits the number of nodes that may participate in charge sharing. This limitation then limits the voltage drop encountered during charge sharing, reducing the severity of the problem. The maximum length of serial chains which have no adverse charge sharing depends upon the circuit type. This maximum length serves as a design limit for that circuit type. If a logic operation requires an AND function having more terms than permitted by this design limitation, then additional gates are used. This has the disadvantage of increasing the gate depth, or the number of gates needed, to perform the logic function. Increasing the gate depth typically requires more circuits for the same function and requires more time to generate the result. This is disadvantageous. One advantage of domino logic is the capability of performing arbitrary logic functions in a single gate. Thus this disadvantage negates one rationale for employing domino logic.

It is known in the art to precharge an additional circuit node to reduce the problem with charge sharing. Typically the next node in the serial chain of N-channel MOSFETs is precharged at the same time as the precharge node. In this case, under conditions where charge sharing may be a problem, there is additional charge at this next node. With this additional charge in the serial chain of N-channel MOSFETs, the worst case amount of charge drained from the precharge node is reduced. As a consequence, the maximum voltage drop on the precharge node is reduced. This reduces the problem of charge sharing. It is known in the art to precharge plural intermediate nodes. This introduces a disadvantage when the precharge node is to be discharged because the logic condition is satisfied. The additional charge on the other node or nodes within the serial chain must also be discharged when all the N-channel MOSFETs are ON. Discharging the precharge node charge and this additional charge requires more time than discharging the precharge node charge alone. One advantage of domino logic is its speed of operation. Thus this disadvantage negates one rationale for employing domino logic.

SUMMARY OF THE INVENTION

This invention is useful in domino logic circuits. In domino logic circuits a precharge device precharges a precharge node during a precharge phase of a clock signal. A logic block receives plural input signals and conditionally discharges the precharge node. In this improvement, a second precharge device precharges an intermediate node when a particular input signal controls its corresponding logic device to be nonconducting. The intermediate node precharged by this second precharge device may be an intermediate node nearest to the precharge node. Alternatively, the intermediate node may be any intermediate node including the last in a serial chain from the precharge node. The input signal controlling the second precharge device preferably controls a logic device last a serial chain from the precharge node. This second precharge device may be used with a third precharge device according to the known art which precharges the intermediate node during the precharge phase.

This domino logic circuit may be used with another precharge device controlled by a second input signal different from the first input signal. This additional precharge device may be used to precharge the same intermediate node or another intermediate node.

If the input signal controlling the second precharge device is unconstrained, then it is not certain that the intermediate node will be precharged during the precharge phase. In that case, the circuit preferably includes a clock controlled precharge device operative during the precharge phase to precharge the intermediate node. The circuit also preferably includes a discharge control device disposed between said logic block and ground to isolate said logic block from ground during the precharge phase preventing discharge. This discharge control device is conducting during the evaluate phase to permit discharge of the precharge node. Alternatively, the input signal may be clocked and guaranteed low during the precharge phase. In this case the clocked precharge of the intermediate node is optional. In addition, the discharge control device may be omitted.

BRIEF DESCRIPTION OF THE DRAWINGS

These and other aspects of this invention are illustrated in the drawings, in which:

FIG. 1 illustrates one embodiment of a domino logic AND gate employing this invention;

FIG. 2 illustrates a first alternative embodiment of a domino logic gate employing a clocked input signal;

FIG. 3 illustrates a second alternative embodiment of a domino logic gate employing a dual rail input and output;

DETAILED DESCRIPTION OF PREFERRED EMBODIMENTS

Figure 4:
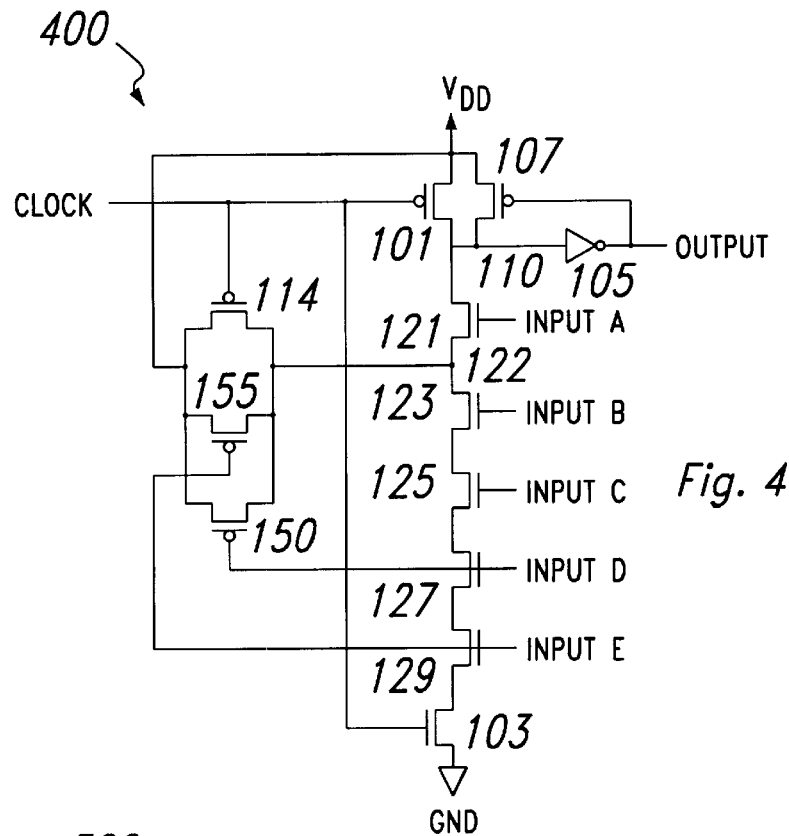
FIG. 4 illustrates a third alternative embodiment similar to that illustrated in FIG. 1 except that two additional devices precharge the same intermediate node.

FIG. 1 illustrates one embodiment of a domino logic AND gate employing this invention. Domino logic AND gate 100 includes a precharge P-channel MOSFET 101 having a source connected to the supply voltage $V_{DD}$ and a drain connected to precharge node 110. The gate of precharge P-channel MOSFET 101 receives a clock signal. When this clock signal is low, i.e. near ground, then precharge P-channel MOSFET 101 connects precharge node 110 to the supply voltage $V_{DD}$. This serves to precharge the precharge node 110 to the voltage $V_{DD}$. When the clock signal is high, i.e. above the switching threshold of precharge P-channel MOSFET 101, then this MOSFET is cut off and precharge node 110 is isolated from the voltage supply.

Domino logic AND gate 100 includes a discharge control N-channel MOSFET 103. Discharge control N-channel MOSFET 103 has a source connected to the logic block 120, which will be further described below. The drain of N-channel MOSFET 103 is connected to ground. The gate of precharge N-channel MOSFET 103 receives the clock signal. When this clock signal is low and precharge P-channel MOSFET 101 is ON, discharge control N-channel MOSFET is cut off. Thus precharge node 110 is isolated from ground because all paths from precharge node 110 to ground are through discharge control N-channel MOSFET 103. When the clock signal is high and precharge P-channel MOSFET 101 is cut off, then this MOSFET is ON. Thus a discharge path can exist between precharge node 110 and ground depending on the logic state of logic block 120.

Inverter 105 senses the voltage on precharge node 110 and provides the circuit output. Domino logic AND gate 100 also includes a keeper P-channel MOSFET 107. Keeper P-channel MOSFET 101 has a source connected to the supply voltage $V_{DD}$ and a drain connected to precharge node 110. The gate of precharge P-channel MOSFET 101 receives the output signal of inverter 105. When the output of inverter 105 is high, keeper P-channel MOSFET 107 is cut off and does not effect the voltage on precharge node 110. When the output of inverter 105 is low, keeper P-channel MOSFET 107 is ON. This serves to couple precharge node 110 to the supply voltage $V_{DD}$ maintaining the charge on this node. As is known in the art, the channel width of keeper P-channel MOSFET 107 is small relative to the channel width of the N-channel MOSFETs in logic block 120. This channel width is selected as just sufficient to maintain the precharge voltage on precharge node 110 if the logic condition of logic block 120 is not satisfied and logic block 120 is not conducting.

Domino logic AND gate 100 includes additional node precharge P-channel MOSFET 114. Additional node precharge P-channel MOSFET 114 has a source connected to the supply voltage $V_{DD}$ and a drain connected to intermediate node 122. The gate of additional node precharge P-channel MOSFET 114 receives the clock signal. Additional node precharge P-channel MOSFET 114 operates like precharge P-channel MOSFET 101. When the clock signal is low, additional node precharge P-channel MOSFET 113 connects intermediate node 122 to the supply voltage $V_{DD}$. When the clock signal is high, additional node precharge P-channel MOSFET 101 cut off and does not effect the charge on intermediate node 122. This is the additional node charging of the prior art discussed above. Note with the addition of P-channel MOSFET 150 described below, inclusion of additional node precharge P-channel MOSFET 114 is optional.

FIG. 1 illustrates logic block 120. In general, logic block can include plural N-channel MOSFETs in both parallel and serial connections. The particular number and connection selected depends upon the logic function to be implemented. Charge sharing can occur in both serial and parallel connections. Note that the existence of one or more parallel paths may cause a large parasitic capacitance at the common node, thus contributing to charge sharing. Though the following example circuits show mostly serial chains for logic block 120, this invention is useful whenever the logic block includes an intermediate node between the precharge node and ground.

In this example logic block 120 includes four serially connected N-channel MOSFETs 121, 123, 125 and 127. The gates of N-channel MOSFETs 121, 123, 125 and 127 receive respective input signals A, B, C and D. During the evaluate phase of the clock signal, i.e. when the clock signal is high, both precharge P-channel MOSFET 101 and additional node precharge P-channel MOSFET 114 are cut off, and discharge control N-channel MOSFET 103 is conducting. If all the input signals A, B, C and D are high, then a discharge path exists between precharge node 110 and ground via logic block N-channel MOSFETS 121, 123, 125, 127 and discharge control N-channel MOSFET 130. The charge on precharge node 110 is discharged. Inverter 105 senses the low voltage resulting from this discharge and drives a high output voltage. Note that the resistance of this discharge path must be sufficiently low to over drive the charge supplied by keeper P-channel MOSFET 107 to switch the state of inverter 105. If not all of the input signals A, B, C and D are high, then no discharge path exists and inverter 105 should not sense a change in voltage. As known in the art, domino logic AND gate 100 thus forms the logic operation A AND B AND C AND D.

Domino logic AND gate 100 includes an additional P-channel MOSFET 150. This P-channel MOSFET 150 provides additional charge to intermediate node 122 during the worst case charge sharing conditions. P-channel MOSFET 150 has a source connected to the supply voltage $V_{DD}$ and a drain connected to intermediate node 122. The gate of P-channel MOSFET 131 receives the input signal D, the same input signal supplied to N-channel MOSFET 127, the last of the chain of serial N-channel MOSFETs. Recall that precharge P-channel MOSFET precharges intermediate node 122 during the precharge phase of the clock signal. During the evaluate phase, precharge P-channel MOSFET 114 is cut off like precharge P-channel MOSFET 101. For this circuit, the worst case charge sharing results if input signals A, B and C are all high and input signal D is low. When input signal D is low P-channel MOSFET 150 is turned ON. This supplies additional charge to intermediate node 122. Note that this additional charge is supplied just when needed, that is when input signal D is low a requirement for the worst case charge sharing. When input signal D is high and N-channel MOSFET 127 is turned ON, P-channel MOSFET 150 is cut off. Thus no additional charge is supplied to intermediate node 122. Accordingly, when the logic condition of logic block 120 is satisfied and N-channel MOSFETs 121, 123, 125 and 127 are all ON, this technique does not introduce additional charge to the intermediate node. Thus the discharge operation is not slowed.

Note that under certain circumstances the addition of P-channel MOSFET may obviate the need for the prior art P-channel MOSFET 114. This would be true if input signal D is known to be low during the precharge phase of the clock signal. This is illustrated as domino logic AND gate 200 in FIG. 2. In FIG. 2 the discharge control N-channel MOSFET 103 is eliminated. As noted in FIG. 2 input signal D is clocked. This means that input signal D is low during the precharge phase of the clock. This turns OFF N-channel MOSFET 127 during this interval. Turning OFF N-channel MOSFET 127 prevents a discharge path from precharge node 110 to ground. This is required during the precharge phase in order that precharge P-channel MOSFET 101 may precharge node 110. During the evaluate phase of the clock, input signal D may remain low or change to high. If input signal D remains low, then the worst case charge sharing is possible. However, P-channel MOSFET 150 remains ON supplying charge to intermediate node 122. This reduces the voltage dip at precharge node 110 due to charge sharing. Alternatively, if input signal D switches to high, N-channel MOSFET 127 is turned ON and P-channel MOSFET 150 is turned OFF. Thus no additional charge is supplied to intermediate node 122 at a time when it is possible that the logic condition of logic block 120 is satisfied and precharge node 110 is to be discharged.

FIG. 3 illustrates application of this invention to a dual rail input and output logic circuit. Domino logic AND gate 300 receives both the true input signals A, B, C and D as well as their inverses $\overline{A}, \overline{B}, \overline{C}$ and $\overline{D}$. Domino logic AND gate 300 produces a true output signal (OUTPUT) and its inverse ($\overline{\text{OUTPUT}}$). Domino logic AND gate 300 includes another precharge node 210 precharged by P-channel MOSFET 201 during the precharge phase of the clock. The voltage at this precharge node 210 is sensed by inverter 205 which includes keeper P-channel MOSFET 207. Inverter 205 produces the inverse output signal $\overline{\text{OUTPUT}}$. Domino logic AND gate 300 includes conditional discharge N-channel MOSFETs 221, 223, 225 and 227. Each of these receives a corresponding inverse input signal $\overline{A}, \overline{B}, \overline{C}$ or $\overline{D}$ and has a source-drain path connected between precharge node 210 and the source of N-channel MOSFET 103. If any of the inverse input signals $\overline{A}, \overline{B}, \overline{C}$ or $\overline{D}$ is high, indicating that not all of the inputs signals is low, then precharge node 210 is discharged and the inverse output signal $\overline{\text{OUTPUT}}$ goes high. Cross-coupled P-channel MOSFETs 211 and 213 sense the first precharge node to discharge and switch on to keep the other precharge node high. Note that an additional precharge P-channel MOSFET is only needed in the true side of domino logic AND gate 300 because this is an AND function. No charge sharing occurs with respect to precharge node 210 regardless of the state of the inputs. If the gate were constructed to perform an OR function, then the serial N-channel MOSFETs would have been on the inverse side of the gates. In this case the additional precharge P-channel MOSFET gated by an input signal would best be used on the inverse side of the gate. As in the case of FIG. 1 above, the additional node precharge P-channel MOSFET 114 is optional and may not be needed in all designs.

FIG. 4 illustrates a five input domino logic AND gate 400. Domino logic AND gate 400 includes an additional serially connected N-channel MOSFET 129. The gate of N-channel MOSFET 129 receives the fifth input signal E. Domino logic AND gate 400 further include yet another precharge P-channel MOSFET 155. The additional precharge P-channel MOSFET 155 precharges intermediate node 122 when input signal E is low. Under this condition N-channel MOSFET 129 is OFF, making the worst case charge sharing possible. Note that the longer serial chain provides additional potential internal parasitic capacitances which may share charge with precharge node 110. The two P-channel MOSFETs precharge intermediate node 122 when either input signal D or input signal E is low. When both input signal D and input signal E are high, P-channel MOSFETS 150 and 155 are both OFF. Thus no charge is supplied to intermediate node under conditions consistent with satisfaction of the logic block condition requiring discharge of precharge node 110. As in the case of FIG. 1 above, the additional node precharge P-channel MOSFET 114 is optional and may not be needed in all designs.

Figure 5:
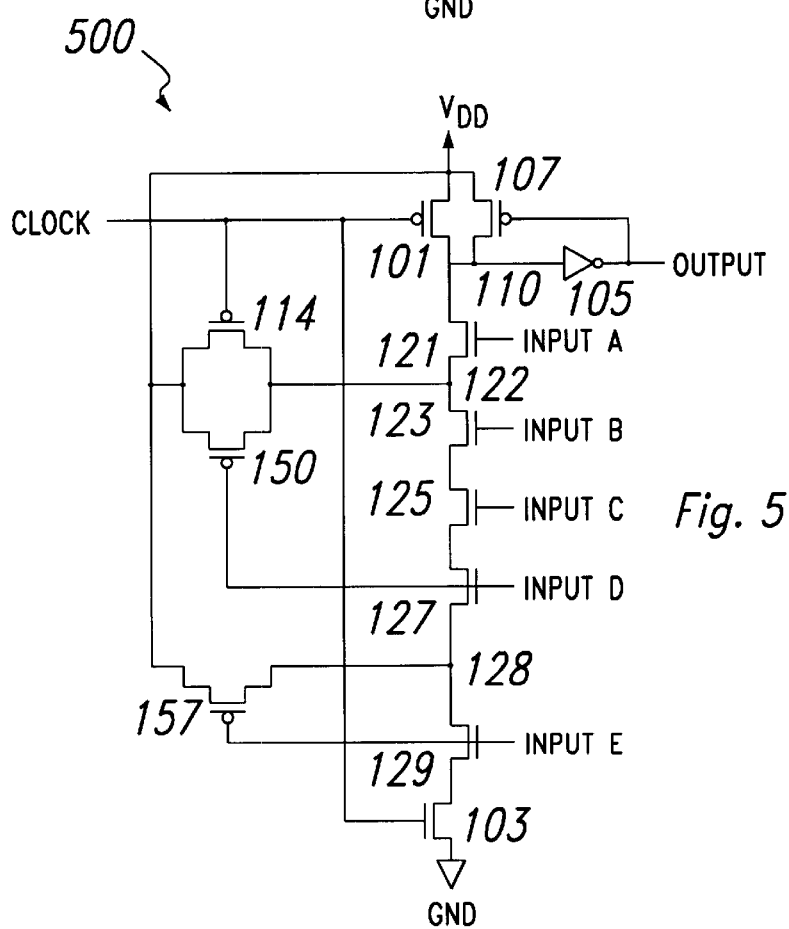
FIG. 5 illustrates a fourth alternative embodiment similar to that illustrated in FIG. 4 except that the two additional devices charge differing intermediate nodes.

FIG. 5 illustrates yet another alternative embodiment domino logic AND circuit 500. As in the case of domino logic AND gate 400, domino logic AND gate 500 is a five input AND gate. Domino logic gate 500 is similar to domino logic gate 400 except that P-channel MOSFET 157 precharges intermediate node 128 rather than intermediate node 122. The selection of which intermediate node to precharge via an input gated signal according to this invention is a design choice. There is a general trade off of noise immunity and speed in the selection of which intermediate node to precharge with an input gated P-channel MOSFET. Greatest noise immunity to charge sharing is achieved by precharging an intermediate node nearer the precharge node. However, if the logic condition is satisfied and the precharge node is to be discharged, this added charge is located further from the ground. The charge must traverse more source-drain channels and thus is slowed. Precharging an intermediate node near the ground in the serial chain does not provide as much reduction of charge sharing. However, this added charge is nearer to ground and must flow thorough fewer source-drain channels to be discharged. Thus precharging an intermediate node nearer to the grounded end of the serial chain provides faster operation. The particular intermediate node selected to receive this additional precharging thus would be determined by whether noise immunity or speed of operation were the primary design goal. Note as illustrated in FIGS. 4 and 5 it is feasible for more than one precharge device to precharge the same intermediate node but two of these additional precharge devices may precharge differing nodes.

This invention provides an additional advantage not immediately apparent. In current logic circuit designs, such as microprocessors and digital signal processors, distribution of the clock signal to all parts of the integrated circuit requires careful planning and specialized techniques. These designs often require carefully balanced clock distribution trees. This requirement for clock distribution across the integrated circuit is particularly important for domino logic, which is very dependent upon the clock signal. This invention permits substitution of input signal gated intermediate node precharging for clock gated intermediate node precharging. Such a substitution reduces the loading upon the clock signal. This reduction in clock loading would enable fewer driver circuits within the clock distribution tree. This leads to reduction in power consumption and integrated circuit area. The thus freed resources could be employed in useful circuits or could contribute to reduction in total integrated circuit power consumption or cost.

What is claimed is:

1. A domino logic circuit comprising:
   a precharge node;
   a first precharge device operative during a precharge phase of a clock signal to connect said precharge node to a first predetermined voltage source thereby precharging said precharge node;
   a logic block receiving a plurality of input signals and disposed between said precharge node and a second predetermined voltage source having a different voltage than said first predetermined voltage source, said logic block forming a conduction path between said precharge node and said second predetermined voltage source thereby discharging said precharge node when said plurality of input signals satisfy a predetermined logic condition, said logic block including a plurality of logic devices disposed in at least one serial chain defining at least one intermediate node between adjacent logic devices, each logic device receiving a corresponding input signal controlling whether said logic device conducts or does not conduct, said at least one serial chain of logic devices thereby discharging said precharge node if said input signals cause said all corresponding logic devices in said at least one serial chain to be conducting during an evaluate phase of said clock signal;
   a second precharge device operative when a predetermined one of said plurality of input signals controls a corresponding logic device in said at least one serial chain to be nonconducting to connect a predetermined intermediate node to said first predetermined voltage source thereby precharging said predetermined intermediate node;
   a sensing circuit for sensing a voltage at said precharge node and forming different logical outputs dependent upon whether said precharge node is precharged or discharged.

2. The domino logic circuit of claim 1, wherein:
   said at least one serial chain includes at least three logic devices defining at least two intermediate nodes; and
   said predetermined intermediate node precharged by said second precharge device is an intermediate node in said at least one serial chain nearest to said precharge node.

3. The domino logic circuit of claim 2, wherein:
   said predetermined one of said plurality of input signals controls a corresponding logic device which is last in said at least one serial chain from said precharge node.

4. The domino logic circuit of claim 2, further comprising:
   a third precharge device operative during said precharge phase of said clock signal to connect said predetermined intermediate node to said first predetermined voltage source thereby precharging said predetermined intermediate node independently of said second precharge device.

5. The domino logic circuit of claim 1, wherein:
   said at least one serial chain includes at least three logic devices defining at least two intermediate nodes; and
   said predetermined intermediate node precharged by said second precharge device is an intermediate node in said at least one serial chain furthest from said precharge node.

6. The domino logic circuit of claim 5, wherein:
   said predetermined one of said plurality of input signals controls a corresponding logic device which is last in said at least one serial chain from said precharge node.

7. The domino logic circuit of claim 5, further comprising:
   a third precharge device operative during said precharge phase of said clock signal to connect an intermediate node in said at least one serial chain nearest to said precharge node to said first predetermined voltage source thereby precharging said nearest intermediate node independently of said second precharge device.

8. The domino logic circuit of claim 1, further comprising:
   said at least one serial chain includes at least three logic devices defining at least two intermediate nodes; and
   a third precharge device operative when a second predetermined one of said plurality of input signals different from said predetermined one of said plurality of input signals controls a corresponding logic device to be nonconducting to connect said predetermined intermediate node to said first predetermined voltage source thereby precharging said predetermined intermediate node independently of said second precharge device.

9. The domino logic circuit of claim 8, wherein:
   said predetermined one of said plurality of input signals and said second predetermined one of said plurality of input signals control corresponding logic devices which are a last two in said at least one serial chain from said precharge node.

10. The domino logic circuit of claim 1, further comprising:
    said at least one serial chain includes at least three logic devices defining at least two intermediate nodes; and
    a third precharge device operative when a second predetermined one of said plurality of input signals different from said predetermined one of said plurality of input signals controls a corresponding logic device to be nonconducting to connect a second predetermined intermediate node different from said predetermined intermediate node to said first predetermined voltage source thereby precharging said second predetermined intermediate node independently of said second precharge device.

11. The domino logic circuit of claim 10, wherein:
    said predetermined one of said plurality of input signals and said second predetermined one of said plurality of input signals control corresponding logic devices which are a last two in said at least one serial chain from said precharge node.

12. The domino logic circuit of claim 1, wherein:

said at least one serial chain includes at least three logic devices defining at least two intermediate nodes; and said predetermined one of said plurality of input signals optionally controls said corresponding logic device in said at least one serial chain to be either conducting or nonconducting during said precharge phase, whereby said second precharge device either does not precharge said precharge node or precharges said precharge node, respectively, during said precharge phase;

said domino logic circuit further comprises a third precharge device operative during said precharge phase of said clock signal to connect an intermediate node in said at least one serial chain nearest to said precharge node to said first predetermined voltage source thereby precharging said nearest intermediate node independently of said second precharge device; and said domino logic circuit further includes a discharge control device disposed between said logic block and said second predetermined voltage source operative during said precharge phase to isolate said logic block from said second predetermined voltage source thereby preventing discharge of said precharge node and operative during said evaluate phase to connect said logic block to said second predetermined voltage source thereby permitting discharge of said precharge node.

13. The domino logic circuit of claim 1, wherein:

said predetermined one of said plurality of input signals optionally controls said corresponding logic device in said at least one serial chain to be nonconducting during said precharge phase, whereby said second precharge device always precharges said precharge node during said precharge phase;

said logic block is directly connected to said second predetermined voltage source without intervention of a logic device.

* * * * *